US007947372B2

(12) United States Patent
Dekempeneer

(10) Patent No.: US 7,947,372 B2
(45) Date of Patent: May 24, 2011

(54) SUBSTRATE COATED WITH A LAYERED STRUCTURE COMPRISING A TETRAHEDRAL CARBON LAYER AND A SOFTER OUTER LAYER

(75) Inventor: Erik Dekempeneer, Oostmalle (BE)

(73) Assignee: Sulzer Metaplas GmbH, Bergisch Gladbach (DE)

( * ) Notice: Subject to any disclaimer, the term of this patent is extended or adjusted under 35 U.S.C. 154(b) by 122 days.

(21) Appl. No.: 12/063,932

(22) PCT Filed: Jul. 13, 2006

(86) PCT No.: PCT/EP2006/064197
§ 371 (c)(1),
(2), (4) Date: May 8, 2008

(87) PCT Pub. No.: WO2007/020139
PCT Pub. Date: Feb. 22, 2007

(65) Prior Publication Data
US 2008/0220257 A1    Sep. 11, 2008

(30) Foreign Application Priority Data

Aug. 18, 2005  (EP) ..................... 05107584

(51) Int. Cl.
*B32B 9/00*     (2006.01)
(52) U.S. Cl. ........ 428/408; 427/577; 428/213; 428/698; 428/701; 428/702
(58) Field of Classification Search ............. 428/408, 428/411.1, 688, 689, 699, 701, 702, 704, 428/634, 213, 698; 106/285, 286.1, 286.8, 106/287.1, 287.16; 423/414, 445 R, 446, 415.1, 324, 325; 427/577
See application file for complete search history.

(56) References Cited

U.S. PATENT DOCUMENTS

| 5,352,493 | A  | * | 10/1994 | Dorfman et al. ............. 427/530 |
| 5,958,542 | A  | * | 9/1999  | Ootake et al. ............. 428/833.5 |
| 6,022,622 | A  | * | 2/2000  | Domoto et al. ............. 428/408 |
| 6,228,471 | B1 | * | 5/2001  | Neerinck et al. ............. 428/216 |
| 6,325,385 | B1 | * | 12/2001 | Iwashita et al. ............. 277/442 |
| 6,562,445 | B2 | * | 5/2003  | Iwamura ................. 428/217 |
| 6,904,935 | B2 | * | 6/2005  | Welty et al. ............. 137/625.17 |

(Continued)

FOREIGN PATENT DOCUMENTS

DE    100 03 827  A1    8/2001

(Continued)

OTHER PUBLICATIONS

Alfred Grill, "Diamond-like carbon: state of the art", Diamond and Related Materials, vol. 8 (1999), pp. 428-434.

(Continued)

*Primary Examiner* — Archene Turner
(74) *Attorney, Agent, or Firm* — Foley & Lardner LLP

(57) ABSTRACT

The invention relates to a metal substrate coated at least partially with a layered structure. The layered structure comprises an intermediate layer deposited on the metal substrate and an amorphous carbon layer deposited on the intermediate layer. The amorphous carbon layer has a Young's modulus lower than 200 GPa. The intermediate layer comprises a tetrahedral carbon layer having a Young's modulus higher than 200 GPa. The invention further relates to a method to reduce the wear on a counterbody of a metal substrate coated with a tetrahedral carbon coating.

18 Claims, 1 Drawing Sheet

U.S. PATENT DOCUMENTS

2002/0012798 A1   1/2002  Veerasamy
2006/0182895 A1*  8/2006  Denul et al. .................. 427/588

FOREIGN PATENT DOCUMENTS

| EP | 0 410 781 B1 | | 1/1991 |
| EP | 2005/090634 | * | 9/2005 |
| JP | 01167211 A | * | 6/1989 |
| JP | 2-143912 A | | 6/1990 |
| WO | 2004/088113 | * | 10/2004 |

OTHER PUBLICATIONS

S. Logothetidis et al., "Nanoindentation studies of multilayer amorphous carbon films", Carbon, vol. 42 (2004), pp. 1133-1136.

* cited by examiner

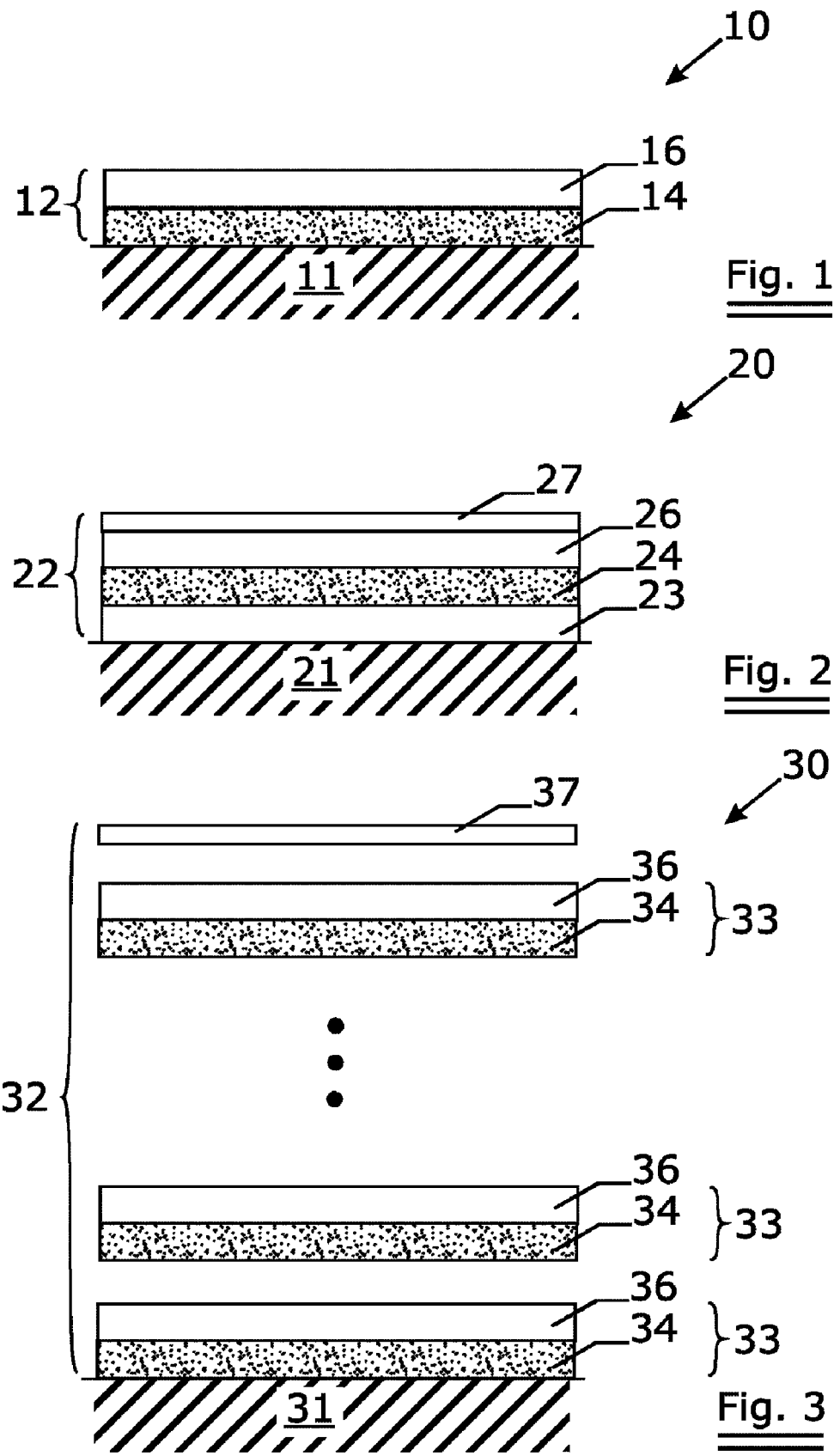

SUBSTRATE COATED WITH A LAYERED STRUCTURE COMPRISING A TETRAHEDRAL CARBON LAYER AND A SOFTER OUTER LAYER

FIELD OF THE INVENTION

The invention relates to a metal substrate coated with a layered structure comprising an intermediate layer deposited on the substrate and an amorphous carbon layer deposited on the intermediate layer. The intermediate layer comprises a tetrahedral carbon layer.

BACKGROUND OF THE INVENTION

The term Diamond Like Carbon (DLC) describes a group of materials comprising carbon with structures and properties resembling that of diamond. Some examples of Diamond Like Carbon coatings are a-C, a-C:H, i-C, ta-C and ta-C:H coatings.

As DLC has many attractive properties including high hardness, chemical inertness, high thermal conductivity, good electrical and optical properties, biocompatibility and excellent tribological behavior, DLC has attracted a considerable interest as coating material.

A rough classification of DLC coatings is given by the fractions of $sp^3$ bonding. Tetrahedral carbon coatings have a high fraction of $sp^3$ bonded carbon, whereas amorphous carbon coatings such as a-C or a-C:H have a lower fraction of $sp^3$ bonding and a higher fraction of $sp^2$ bonding.

A second classification is given by the hydrogen content. The DLC coatings can be classified in non-hydrogenated coatings (ta-C and a-C) and hydrogenated coatings (ta-C:H and a-C:H).

The group of tetrahedral carbon coatings shows many interesting properties like a high hardness (resembling the hardness of diamond) and a high Young's modulus. These properties make tetrahedral carbon coatings ideal for many challenging wear-resistant applications.

A disadvantage of tetrahedral carbon coatings is their high roughness. In case tetrahedral carbon coatings are used as tribological coating, the wear on the counterbody can be unacceptable high.

SUMMARY OF THE INVENTION

It is an object of the present invention to provide a metal substrate coated with a layered structure comprising tetrahedral carbon avoiding the drawbacks of the prior art.

It is another object of the present invention to provide a metal substrate coated with a layered structure comprising a hard tetrahedral carbon layer and a softer outer layer.

It is a further object of the invention to provide a method to avoid the wear on the counterbody of a metal substrate coated with a tetrahedral carbon coating.

According to a first aspect of the present invention a metal substrate coated at last partially with a layered structure is provided. The layered structure comprises an intermediate layer deposited on the metal substrate and an amorphous carbon layer deposited on the intermediate layer. The amorphous carbon layer has a Young's modulus preferably lower than 200 GPa. The intermediate layer comprises a tetrahedral carbon layer having a Young's modulus higher than 200 GPa.

The layered structure may comprise a number of periods, each period comprising an intermediate layer comprising at least one tetrahedral carbon layer having a Young's modulus higher than 200 GPa and an amorphous carbon layer having a Young's modulus lower than 200 GPa. The number of periods may range between 2 and 100 and is for example between 2 and 30, as for example 10 or 15.

Tetrahedral Carbon Layer

The tetrahedral carbon layer has a Young's modulus higher than 200 GPa. Preferably, the Young's modulus is ranging between 200 and 800 GPa. More preferably, the tetrahedral carbon layer has a Young's modulus of at least 300 GPa, as for example 400 GPa, 500 GPa or 600 GPa.

The hardness of the tetrahedral carbon layer is preferably higher than 20 GPa. The preferred range for the hardness of the tetrahedral carbon layer is between 20 GPa and 80 GPa. More preferably, the hardness of the tetrahedral carbon layer is at least 30 GPa, as for example 40 GPa, 50 GPa or 60 GPa.

The fraction of $sp^3$ bonded carbon of tetrahedral carbon is preferably higher than 50% as for example between 50% and 90%, such as 80%.

The tetrahedral carbon layer may comprise non-hydrogenated tetrahedral carbon (ta-C) or hydrogenated tetrahedral carbon (ta-C:H). In case of hydrogenated tetrahedral carbon, the hydrogen concentration is preferably between lower than 20 at %, as for example 10 at %.

A preferred tetrahedral carbon layer comprises non-hydrogenated tetrahedral carbon (ta-C) having a high fraction of $sp^3$ bonded carbon, such as a fraction of $sp^3$ bonded carbon of 80%.

The tetrahedral carbon layer can be deposited by a number of different techniques.

Preferred deposition techniques comprise ion beam deposition, pulsed laser deposition, arc deposition, such as filtered or non-filtered arc deposition, chemical vapor deposition, such as enhanced plasma assisted chemical vapor deposition and laser arc deposition.

To influence the properties as for example the electrical conductivity of the layered structure according to the present invention, the tetrahedral carbon layer can be doped with a metal. In principle any metal can be used as dopant.

Preferably, the dopant comprises one or more transition metal such as Ti, Zr, Hf, V, Nb, Ta, Cr, Mo, W, Mn, Re, Fe, Co, Ir, Ni, Pd and Pt. Other dopants may comprise B, Li, Na, Si, Ge, Te, O, Mg, Cu, Al, Ag and Au.

Preferred dopants are W, Zr and Ti.

The tetrahedral carbon layer preferably has a thickness higher than 0.5 µm as for example higher than 1 µm.

Amorphous Carbon Layer

The amorphous carbon layer has a Young's modulus lower than 200 GPa.

The amorphous carbon layer may comprise an amorphous hydrogenated carbon (a-C:H) layer or a diamond like nanocomposite (DLN) layer.

The amorphous hydrogenated carbon layer (a-C:H) preferably has a fraction of $sp^3$ bonded carbon lower than 40%. More preferably, the $sp^3$ fraction is lower than 30%.

The hydrogen content is preferably between 20 and 30%.

The hardness of the amorphous hydrogenated carbon layer (a-C:H) is preferably between 15 GPa and 25 GPa. More preferably, the hardness of the amorphous hydrogenated carbon layer (a-C:H) is between 18 GPa and 25 GPa.

A diamond like nanocomposite (DLN) layer comprises an amorphous structure of C, H, Si and O. Generally, diamond like nanocomposite coatings comprise two interpenetrating networks a-C:H and a-Si:O. Diamond like nanocomposite coatings are commercially known as DYLYN® coatings.

The hardness of a diamond layer nanocomposite layer is preferably between 10 GPa and 20 GPa.

Preferably, the nanocomposite composition comprises in proportion to the sum of C, Si, and O: 40 to 90 at % C, 5 to 40 at % Si, and 5 to 25 at % O.

Preferably, the diamond-like nanocomposite composition comprises two interpenetrating networks of a-C:H and a-Si: O.

The amorphous carbon layer (a-C:H layer or DLN layer) may further be doped with a metal, such as a transition metal as for example Ti, Zr, Hf, V, Nb, Ta, Cr, Mo, W, Mn, Re, Fe, Co, Ir, Ni, Pd and Pt.

Other dopants may comprise B, Li, Na, Si, Ge, Te, O, Mg, Cu, Al, Ag and Au.

Preferred dopants are W, Zr and Ti.

The amorphous carbon layer preferably has a thickness higher than 0.5 μm as for example higher than 1 μm.

The thickness of the layered structure is preferably higher than 0.5 μm or higher than 1 μm, as for example 2 μm or 3 μm;

Substrate

The substrate may comprise any metal substrate, either flexible or rigid. Examples of substrates comprise steel substrates, hard metal substrates, aluminium or aluminium alloy substrates, titanium or titanium alloy substrates or copper and copper alloy substrates.

The layered coating according to the present invention is in particular suitable to be applied on valve train components such as tappets, wrist pins, fingers, finger followers, camshafts, rocker arms, pistons, piston rings, gears, valves, valve springs and lifters.

Adhesion Promoting Layer

According to an embodiment of the present invention, the layered structure may comprise an adhesion promoting layer. The adhesion promoting layer is deposited on the metal substrate before the deposition of the intermediate layer.

The adhesion promoting layer may comprise any metal.

Preferably, the adhesion promoting layer comprises at least one element of the group consisting of silicon and the elements of group IVB, the elements of group VB, the elements of Group VIB of the periodic table. Preferred intermediate layers comprise Ti and/or Cr.

Possibly, the adhesion promoting layer comprises more than one layer, for example two or more metal layers, each layer comprising a metal selected from the group consisting of silicon, the elements of group IVB, the elements of group VB and the elements of group VIB of the periodic table, as for example a Ti or Cr layer.

Alternatively, the adhesion promoting layer may comprise one or more layers of a carbide, a nitride, a carbonitride, an oxycarbide, an oxynitride, an oxycarbonitride of a metal selected from the group consisting of silicon, the elements of group IVB, the elements of group VB and the elements of group VIB of the periodic table.

Some examples are TiN, CrN, TiC, $Cr_2C_3$, TiCN and CrCN.

Furthermore, the adhesion promoting layer may comprise any combination of one or metal layers of a metal selected from the group consisting of silicon, the elements of group IVB, the elements of group VB and the elements of group VIB of the periodic table and one or more layers of a carbide, a nitride, a carbonitride, an oxycarbide, an oxynitride, an oxycarbonitride of a metal selected from the group consisting of silicon, the elements of group IVB, the elements of group VB and the elements of group VIB of the periodic table.

Some examples of intermediate layers comprise the combination of a metal layer and a metal carbide layer, the combination of a metal layer and a metal nitride layer, the combination of a metal layer and a metal carbonitride layer, the combination of a first metal layer, a metal carbide layer and a second metal layer and the combination of a first metal layer, a metal nitride layer and a second metal layer.

The thickness of the adhesion promoting layer is preferably between 1 nm and 1000 nm, as for example between 10 and 500 nm.

The adhesion promoting layer can be deposited by any technique known in the art as for example physical vapor deposition, such as sputtering or evaporation.

Top Layer

According to another embodiment of the present invention, the layered structure may further comprise a top layer. The top layer is deposited on the amorphous carbon layer.

The top layer may be chosen in function of the desired properties of the layered structure one wants to obtain, as for example high hardness, high wear resistance and/or anti-sticking properties.

A preferred embodiment of a layered structure deposited on a metal substrate according to the present invention comprises a tetrahedral carbon layer deposited on a metal substrate, a diamond like nanocomposite (DLN) deposited on top of this tetrahedral carbon layer and an amorphous carbon layer (such as a-C:H) deposited on top of this diamond like nanocomposite (DLN).

The layered structure may also comprise a number of periods, each period comprising a tetrahedral carbon layer, a diamond like nanocomposite (DLN) layer and an amorphous carbon layer (such as a-C:H). The number of periods may range between 2 and 100 and is for example between 2 and 30, as for example 10 or 15.

The layered structure according to the present invention comprising a tetrahedral carbon layer and an amorphous carbon having a Young's modulus lower than 200 GPa deposited on this tetrahedral carbon layer is in particular suitable to reduce the friction of components to be used in dry conditions (i.e. without using a lubricant), such as in vacuum in air or in various corrosive or non-corrosive gasses.

According to a second aspect of the present invention, a method to reduce the wear on the counterbody of a metal substrate coated with a tetrahedral carbon coating is provided.

The method comprises the step of
providing a metal substrate coated with a tetrahedral carbon coating;
applying an amorphous carbon layer on top of said tetrahedral carbon coating, said amorphous carbon layer having a hardness lower than the hardness of the tetrahedral carbon layer.

A tetrahedral carbon layer is characterized by a high hardness and a high roughness.

When a metal substrate coated with such a hard and rough layer is used for applications whereby friction is created on a counterbody, the wear on the counterbody of the coated metal substrate will be high.

To reduce the wear on the counterbody, according to the present invention a layer softer than the tetrahedral carbon layer is applied on the tetrahedral carbon layer as top layer. This top layer positively influences the running-in wear behaviour of the tetrahedral carbon layer.

Preferred top layers comprise amorphous carbon layers having a Young's modulus lower than 200 GPa.

The amorphous carbon layer may comprise an amorphous hydrogenated carbon (a-C:H) layer or a diamond like nanocomposite (DLN) layer.

In a preferred embodiment, the hardness of the top layer is gradually changing from a hardness equal or close to the hardness of the tetrahedral carbon layer to a hardness lower than the tetrahedral carbon layer.

BRIEF DESCRIPTION OF THE DRAWINGS

The invention will now be described into more detail with reference to the accompanying drawings wherein FIG. 1 to 3 show in cross-section different embodiments of layered structures according to the present invention.

DESCRIPTION OF THE PREFERRED EMBODIMENTS OF THE INVENTION

FIG. 1 gives a cross-section of a first embodiment of a coated metal substrate 10 according to the present invention. A metal substrate 11 is coated with a layered structure 12.

The layered structure comprises an intermediate layer 14 deposited on the metal substrate 10. The intermediate layer comprises a tetrahedral carbon layer.

an amorphous carbon layer 16 deposited on the intermediate layer 14. The amorphous carbon layer comprises a hydrogenated amorphous carbon layer, a-C:H.

The intermediate layer 14 has a thickness of 1 μm and a Young's modulus of 400 GPa.

The amorphous carbon layer 16 has a thickness of 1 μm and a Young's modulus of 170 GPa.

In an alternative embodiment of the present invention, the amorphous carbon layer 16 comprises a diamond-like nanocomposite layer comprising two interpenetrating networks a-C:H and a-Si:O.

This amorphous carbon layer 16 has a thickness of 1 μm and a Young's modulus of 150 GPa.

FIG. 2 shows the cross-section of a second embodiment of a coated metal substrate 20 according to the present invention. A metal substrate 21 is coated with a layered structure 22.

The layered structure comprises an adhesion promoting layer 23 deposited on the metal substrate. The adhesion promoting layer 23 comprises for example a chromium or chromium based layer or a titanium or titanium based layer;

an intermediate layer 24 deposited on the adhesion promoting layer 23. The intermediate layer 24 comprises a tetrahedral carbon layer;

an amorphous carbon layer 26 deposited on the intermediate layer 24. The amorphous carbon layer comprises a hydrogenated amorphous carbon layer, a-C:H.

The adhesion promoting layer 23 has a thickness of 0.2 μm; the intermediate layer 24 has a thickness of 1 μm and a Young's modulus of 400 GPa and the amorphous carbon layer 26 has a thickness of 1 μm and a Young's modulus of 170 GPa.

Possibly, the layered structure 22 further comprises a top layer 27 deposited on the amorphous carbon layer 26. The top layer is for example a layer characterized by a high hardness, high wear resistance and/or having anti-sticking properties.

FIG. 3 shows the cross-section of a third embodiment of a coated metal substrate 30 according to the present invention.

A metal substrate 31 is coated with a layered structure 32 comprising a number of periods 33. Each period comprises an intermediate layer 34 and an amorphous carbon layer 36. The number of periods is for example 10.

Possibly, the layered structure 32 further comprises a top layer 37.

The invention claimed is:

1. A metal substrate, comprising:

a layered structure at least partially coating the substrate, said layered structure comprising an intermediate layer deposited on said substrate and an amorphous carbon deposited on said intermediate layer, said amorphous carbon layer having a Young's modulus lower than 200 GPa, wherein said intermediate layer comprises a tetrahedral carbon layer having a Young's modulus higher than 200 GPa, and wherein said amorphous carbon layer comprises a diamond-like nanocomposite (DLN) layer comprising an amorphous structure of C, H, Si and O.

2. A substrate according to claim 1, wherein said layered structure comprises a number of periods, each period comprising an intermediate layer comprising at least one tetrahedral carbon layer having a Young's modulus higher than 200 GPa and an amorphous carbon layer having a Young's modulus lower than 200 GPa, wherein said number of periods is between 2 and 100.

3. A substrate according to claim 1, wherein said tetrahedral carbon layer has a Young's modulus ranging between 200 and 800 GPa.

4. A substrate according to claim 1, wherein said tetrahedral carbon layer has a hardness higher than 20 GPa.

5. A substrate according to claim 1, wherein said tetrahedral carbon layer has a fraction of sp3 bonded carbon higher than 30%.

6. A substrate according to claim 1, wherein said tetrahedral carbon layer is selected from a group consisting of non-hydrogenated tetrahedral carbon (ta-C) and hydrogenated tetrahedral carbon (ta-C:H).

7. A substrate according to claim 1, wherein said tetrahedral carbon layer is doped with at least one metal.

8. A substrate according to claim 1, wherein said amorphous carbon layer is doped with at least one metal.

9. A substrate according to claim 1, wherein said layered structure comprises an adhesion promoting layer deposited on said substrate before deposition of said intermediate layer.

10. A substrate according to claim 9, wherein said adhesion promoting layer comprises at least one layer, said layer comprising at least one element of a group consisting of: silicon and elements of group IVB, elements of group VB, and elements of Group VIB of the periodic table.

11. A substrate according to claim 9, wherein said adhesion promoting layer comprises at least one metal layer, said metal layer comprising at least one element of a group consisting of silicon and elements of group IVB, elements of group VB, and elements of group VIB of the periodic table.

12. A substrate according to claim 9, wherein said adhesion promoting layer comprises at least one layer selected from a group consisting of: carbides, nitrides, carbonitrides, oxycarbides, oxynitrides, and oxycarbonitrides of at least one element of a group consisting of: silicon, elements of group IVB, elements of group VB, and elements of group VIB of the periodic table.

13. A substrate according to claim 9, wherein said adhesion promoting layer comprises a combination of at least one metal layer of a metal selected from a group consisting of: silicon, elements of group IVB, elements of group VB, and elements of group VIB of the periodic table, and at least one layer of a carbide, a nitride, a carbonitride, an oxycarbide, an oxynitride, and an oxycarbonitride of a metal selected from a group consisting of: silicon, elements of group IVB, elements of group VB, and elements of group VIB of the periodic table.

14. A substrate according to claim 1, wherein said layered structure further comprises a top layer, said top layer being deposited on said amorphous carbon layer.

15. A substrate according to claim 1, wherein the diamond-like nanocomposite (DLN) layer comprises two interpenetrating networks of a-C:H and a-Si:O, a first network of predominantly sp3 bonded carbon in a diamond-like carbon network stabilized by hydrogen, and a second network of silicon stabilized by oxygen.

16. A substrate according to claim 1, wherein the diamond-like nanocomposite (DLN) layer comprises in proportion to a sum of C, Si, and O: 40 to 90 at % C, 5 to 40 at % Si, and 5 to 25 at % O.

17. A method to reduce the wear on a counterbody of a metal substrate coated with a tetrahedral carbon coating, said method comprising the steps of:

providing a metal substrate and at least partially coating the substrate with a layered structure comprising an intermediate layer deposited on said substrate and an amorphous carbon deposited on said intermediate layer;

depositing the intermediate layer on the substrate, wherein said intermediate layer comprises a tetrahedral carbon layer having a Young's modulus higher than 200 GPa, applying the amorphous carbon layer on top of said tetrahedral carbon coating, said amorphous carbon layer having a hardness lower than the hardness of said tetrahedral carbon layer, wherein the amorphous carbon layer having a Young's modulus lower than 200 GPa, wherein said amorphous carbon layer comprises a diamond-like nanocomposite (DLN) layer comprising an amorphous structure of C, H, Si and O.

18. A method according to claim 17, wherein the hardness of said amorphous carbon layer is gradually changing from a hardness equal or close to the hardness of the tetrahedral carbon layer to a hardness lower than the tetrahedral carbon layer.

* * * * *